United States Patent
Endo et al.

(10) Patent No.: US 7,544,583 B2
(45) Date of Patent: Jun. 9, 2009

(54) SOI WAFER AND ITS MANUFACTURING METHOD

(75) Inventors: Akihiko Endo, Tokyo (JP); Nobuyuki Morimoto, Tokyo (JP)

(73) Assignee: Sumco Corporation, Tokyo (JP)

( * ) Notice: Subject to any disclaimer, the term of this patent is extended or adjusted under 35 U.S.C. 154(b) by 275 days.

(21) Appl. No.: 10/570,668

(22) PCT Filed: Sep. 8, 2004

(86) PCT No.: PCT/JP2004/013070

§ 371 (c)(1),
(2), (4) Date: Mar. 6, 2006

(87) PCT Pub. No.: WO2005/024918

PCT Pub. Date: Mar. 17, 2005

(65) Prior Publication Data

US 2007/0026637 A1   Feb. 1, 2007

(30) Foreign Application Priority Data

Sep. 8, 2003   (JP) .............................. 2003-315990

(51) Int. Cl.
*H01L 21/30* (2006.01)
(52) U.S. Cl. ............................... 438/455; 257/E21.561
(58) Field of Classification Search ................. 438/455, 438/458; 257/E21.546, E21.561
See application file for complete search history.

(56) References Cited

U.S. PATENT DOCUMENTS

| 6,224,668 | B1* | 5/2001 | Tamatsuka ................... 117/84 |
| 6,709,957 | B2* | 3/2004 | Asayama et al. ............ 438/509 |
| 6,843,847 | B1 | 1/2005 | Lida et al. |
| 7,364,618 | B2* | 4/2008 | Hourai et al. .................. 117/20 |
| 7,397,110 | B2* | 7/2008 | Takase et al. ................ 257/611 |
| 2005/0255671 | A1* | 11/2005 | Falster et al. ................. 438/455 |
| 2006/0113594 | A1* | 6/2006 | Sakurada et al. ............. 257/347 |
| 2006/0177991 | A1* | 8/2006 | Murakami et al. ........... 438/455 |

FOREIGN PATENT DOCUMENTS

| JP | 2-267195 | 10/1990 |
| JP | 9-64319 | 3/1997 |
| JP | 9-326396 | 12/1997 |
| JP | 2000-31439 | 1/2000 |
| JP | 2001-146498 | 5/2001 |

OTHER PUBLICATIONS

W.R. Runyan and T.J. Schaffner, "Semiconductor Measurements and Instrumentation", New York: McGraw-Hill, 2nd edition, 1998, pp. 99-100.*

(Continued)

*Primary Examiner*—Bradley K Smith
(74) *Attorney, Agent, or Firm*—Greenblum & Bernstein, P.L.C.

(57) ABSTRACT

Since a supporting wafer contains nitrogen of $1\times10^{14}$ atmos/$cm^3$ and interstitial oxygen atom concentration, Oi, (old ASTM) of $13\times10^{17}$ atoms/$cm^3$, therefore a part of the metal impurities in an active layer wafer and the metal impurities in a bonded wafer can be captured by the BMD and the OSF in the wafer during the heat treatment after the bonding. Consequently, the contamination from the metal impurities in the active layer can be reduced.

9 Claims, 2 Drawing Sheets

OTHER PUBLICATIONS

Fumio Shimura, "Semiconductor and Silicon Crystal Technology", Academic Press, Inc., San Diego, New York, Berkeley, Boston, London, Sydney, Tokyo, Toronto, 1989, pp. ii-viii, 1, 232-233, and 274-275.

U.S. Appl. No. 10/570,665 to Endo et al., which was filed on Mar. 6, 2006.

U.S. Appl. No. 10/570,669 to Endo et al., which was filed on Mar. 6, 2006.

U.S. Appl. No. 10/570,663 to Endo et al., which was filed on Mar. 6, 2006.

U.S. Appl. No. 10/569,942 to Endo et al., which was filed on Feb. 28, 2006.

U.S. Appl. No. 10/570,353 to Morimoto et al., which was filed on Mar. 3, 2006.

U.S. Appl. No. 10/570,354 to Morimoto et al., which was filed on Mar. 3, 2006.

\* cited by examiner

SOI WAFER AND ITS MANUFACTURING METHOD

FIELD OF THE INVENTION

The present invention relates to an SOI wafer and a manufacturing method thereof, and more particularly to a technology for manufacturing an SOI wafer inexpensively in the smart cut method, in which a degree of contamination from metal impurities in an active layer can be reduced, a sufficient mechanical strength can be obtained to suppress an occurrence of slip in a supporting wafer and an accuracy in the LPD evaluation of an active layer of thin film can be improved.

DESCRIPTION OF THE PRIOR ART

Recently, film thickness reduction of an active layer (0.05 μm or thinner) has been progressed in conjunction with a highly densified integration of devices. There has been developed the smart cut method as disclosed in the Patent Document 1 as a method for manufacturing a semiconductor substrate having an SOI (Silicon On Insulator) structure for achieving the above-mentioned film thickness reduction.

In the smart cut method, firstly a wafer for active layer, which has been processed to have an oxide film formed thereon and then ion-implanted with hydrogen at a predetermined depth thereof via the oxide film, is bonded with a supporting wafer in a room temperature, and secondly, thus obtained bonded wafer is introduced into a furnace for heat treatment, where it is heat treated at 500° C. for 30 minutes to thereby cleave and separate a part of the active layer wafer at the site of the ion-implanted area, which is followed by the step of heat treatment for bonding applied to the bonded wafer in order to enhance the bonding strength. Thus a bonded SOI substrate can be produced, which comprises the supporting wafer and the active layer wafer with a buried silicon oxide film interposed therebetween. In the step of the heat treatment for bonding, a heat treatment is applied to the bonded SOI substrate at 1100° C. in an atmospheric gas of oxygen or nitrogen for two hours.

It is to be noticeable concerning this method that a small quantity of metal impurities tends to be introduced and mixed in the active layer wafer and the active layer in the process using the high temperature, such as the steps of hydrogen ion implantation and the step of heat treatment for bonding. The metal impurities, such as Fe, Cu, among others can permeate through the buried silicon oxide film during the heat treatment after the bonding step and further diffused into the supporting wafer. In this regard, there is known one method referred to as the IG (Intrinsic Gettering) method, for example, as disclosed in the Patent Document 1, which takes advantage of the above-discussed phenomenon to capture the metal impurities in the supporting wafer.

The invention as disclosed in the above-cited Patent Document 1 has employed a silicon wafer of n-type having a specific resistance of 10 Ω cm and an oxide concentration of $1 \times 10^{18}$ atoms/cm$^3$ for the supporting wafer. The prepared wafer is annealed to form an oxide deposit therein, and thus formed oxide deposit then serves as a gettering site to capture the metal impurities including Fe, Cu, which have permeated through the buried silicon oxide film, in the region of supporting wafer. Resultantly, this can reduce the degree of contamination from the metal impurities in the active layer.

[Patent Document 1]

Japanese Patent Laid-open Publication No. Hei9-326396

SUMMERY OF THE INVENTION

Problem to be Solved by the Invention

However, such a supporting wafer as described above, comprising the oxide deposit produced based on the oxygen concentration of the order of $1 \times 10^{18}$ atoms/cm$^3$ serving as the gettering site, does not work sufficient to capture the metal impurities in the active layer wafer or the active layer.

In addition, the heat treatment for bonding involves the heat treatment as high as 1100° C. This inversely stimulates the occurrence of slip in the surface defined in the supporting side of the supporting wafer (such as a contact surface with a boat). In order to improve this situation, the prior art has employed a method in which the bonded wafer is carried by a wafer retaining jig such as an annular susceptor made of ceramics or a wafer boat having an annular wafer retaining portion, but this solution has a problem from the viewpoint of cost.

Further, in recent years, the film thickness has been reduced as thin as 0.10 μm or thinner (e.g., 0.02 μm to 0.05 μm) for the active layer and 0.15 μm for the buried silicon oxide film. Owing to this, in evaluating the LPD (Light Point Defect) by using a surface inspection device, there has arisen a fear that a micro void could be detected as a pseudo defect. The term "micro void" used herein refers to a minute gap present between the silicon oxide film and the supporting wafer (such as an emerging COP). Such a detection of the micro void as the pseudo defect comes from the fact that a laser light used for the measurement can pass through the active layer of thin film and the buried silicon oxide film. As a result, the reliability of the LPD evaluation has been made low.

To solve the problem of such pseudo defect, it is contemplated by way of example to use a silicon wafer free from COP as disclosed in the Japanese Patent Laid-open Publication No. Hei2-267195 for the supporting wafer.

In the method as disclosed in the above-cited Japanese Patent Laid-open Publication No. Hei2-267195, a monocrystal ingot of silicon is grown by using a rate of 0.8 mm/min or lower for the pulling up in the CZ method. In this case, the silicon is made to grow by pulling it up at a low rate, and further the thermal environment in the furnace is optimized during the pulling-up process, so that there occurs no deposition of COP in the monocrystal ingot of silicon. If the silicon wafer free from COP is used for the supporting wafer, the above-mentioned micro void would be no more generated.

However, this method has been suffered from a problem that the attempt for eliminating the COP decreases a density of vacancy in the crystal, adversely making it difficult to obtain an oxide deposit that requires the vacancy.

An object of the present invention is to provide an SOI wafer and a manufacturing method thereof, in which a degree of contamination in an active layer resultant from metal impurities contained therein can be reduced and the occurrence of slip of the supporting wafer can be suppressed, as well.

Another object of the present invention is to provide a method for manufacturing the SOI wafer as described above at low cost by using the smart cut method.

Still another object of the present invention is to provide an SOI wafer and a manufacturing method thereof capable of improving the reliability in the LPD evaluation of an active layer of thin film.

Means to Solve the Problem

A first invention provides a manufacturing method of an SOI wafer, comprising the steps of:

bonding a wafer for active layer with a supporting wafer via an insulating film interposed therebetween to thereby form a bonded wafer; and then reducing a film thickness in a part of the active layer wafer of the bonded wafer to thereby form an SOI layer for manufacturing the SOI wafer, wherein the supporting wafer has an oxidation induced stacking fault (OSF) entirely across a surface thereof.

A second invention provides a manufacturing method of an SOI wafer as defined in the first invention, in which the supporting wafer has a nitrogen concentration in a range of $1 \times 10^{14}$ atoms/cm$^3$ to $3 \times 10^{15}$ atoms/cm$^3$ and an oxygen concentration not lower than $12 \times 10^{17}$ atoms/cm$^3$ (old ASTM).

According to the first and the second inventions, the metal impurities of Fe, Cu that has diffused outward among the metal impurities contained in the active layer wafer or the active layer can be captured by the oxide deposit (BMD; Bulk Micro Defects) or the oxidation induced stacking fault (OSF) resultant from the BMD.

The crystal with the OSF generated entirely across the surface of the wafer can be obtained by controlling a temperature gradient during the pulling up and a rate of pulling up appropriately.

Further, the metal impurities Cu, Fe that were present in the supporting wafer and have moved through the buried insulating film into the active layer wafer or the active layer can be captured by the COP or OSF (hereinafter referred to as a defect), as well. It is a matter of course that the other metal impurities in the supporting wafer can be captured by these defects. Consequently, the degree of contamination in the active layer from the metal impurities contained therein can be lowered.

Further, the supporting wafer contains the oxygen and the nitrogen, which are present at a high concentration, respectively. Specifically, the oxygen is contained in the supporting wafer at the concentration of $12 \times 10^{17}$ atoms/cm$^3$ by the old ASTM measurement and the nitrogen concentration indicates a value in a range of $1 \times 10^{14}$ atoms/cm$^3$ to $3 \times 10^{15}$ atmos/cm$^3$ as calculated from a segregation coefficient determined after an addition of a predetermined amount of silicon nitride in the pulling up of the crystal. When the oxygen and the nitrogen are contained in the wafer by the concentration as described above, the pulling up condition can be optimized by causing the OSF to be generated entirely across the wafer surface, which makes a defect density in the supporting wafer equal to or higher than $1 \times 10^9$/cm$^3$. As a result, the mechanical strength of the supporting wafer can be enhanced so as to prevent the occurrence of slip in the supporting wafer during the heat treatment. Emphasis is placed on this preventive effect of the slip in the supporting wafer especially in a bonded wafer having the diameter exceeding 300 mm.

The type of the active layer wafer and the supporting wafer may employ, a monocrystal silicon wafer, a germanium wafer, a SiC wafer and the like, for example.

The insulating film may employ an oxide film, a nitride film and the like, for example.

The thickness of the insulating film may be, for example, thinner than 1.0 μm, preferably in a range of 0.1 μm to 0.2 μm.

The thickness of the active layer may not be limited. For example, the film thickness in a range of 1 μm to 10 μm may be employed for the active layer of thick film. The film thickness in a range of 0.01 μm to 1 μm may be employed for the active layer of thin film.

The nitrogen concentration lower than $1 \times 10^{14}$ atoms/cm$^3$ in the supporting wafer could not generate a sufficient amount of oxygen deposit and/or OSF associated therewith. Inversely, with the nitrogen concentration more than $3 \times 10^{15}$ atoms/cm$^3$, it exceeds the limit of solid solubility of the nitrogen, thereby making it impossible to pull up non-dislocation crystal. A preferred concentration of the nitrogen is in a range of $2 \times 10^{14}$ to $1 \times 10^{15}$ atmos/cm$^3$.

The oxygen concentration lower than $12 \times 10^{17}$ atmos/cm$^3$ in the supporting wafer could not generate a sufficient amount of oxygen deposit and/or OSF associated therewith. A condition of pulling-up operation for generating the OSF entirely across the wafer surface may be defined by a value of V/G in a range of 0.2 to 0.3 mm$^2$/°C.· mm, which represents a relationship between the temperature gradient (G) in the vicinity of the solid-liquid interface and the rate of pulling up (V) in the CZ method. A preferred concentration of oxygen may be in a range of $13 \times 10^{17}$ atoms/cm$^3$ to $15 \times 10^{17}$ atmos/cm$^3$. The term, old ASTM, used herein represents one of the definitions of the oxygen concentration in the silicon and one of the techniques for converting a FT-IR spectrum to an oxygen concentration.

A third invention provides a manufacturing method of an SOI wafer, comprising the steps of:

bonding a wafer for active layer with a supporting wafer via an insulating film interposed therebetween to thereby form a bonded wafer; and then reducing a film thickness in a part of said active layer wafer of the bonded wafer to thereby form an SOI layer for manufacturing the SOI wafer, wherein the supporting wafer has an oxygen concentration not lower than $16 \times 10^{17}$ atoms/cm$^3$ (old ASTM).

According to the third invention, the metal impurities Cu, Fe among others that were contained in the active layer wafer or the active layer and have diffused and thereby permeated through the buried insulating film into the supporting wafer can be captured by the defect such as the BMD or OSF in the supporting wafer. Further, the metal impurities including the Cu, Fe present in the supporting wafer can be captured by the defect, as well. Consequently, the degree of contamination in the active layer from the metal impurities contained therein can be ultimately lowered.

Further, the supporting wafer contains the oxygen at such a high concentration of $16 \times 10^{17}$ atoms/cm$^3$ or higher. With such a large amount of oxygen contained in the supporting wafer, the defect density in the supporting wafer appears to be $1 \times 10^{19}$/cm$^3$ or higher, even if no nitrogen is added. In addition, if the oxygen concentration reaches a value of $16 \times 10^{17}$ atoms/cm$^3$ or higher, the BMD density consequently exhibits a value sufficient to suppress the occurrence of slip without the need for selecting such a pulling up condition that can cause the generation of OSF entirely a cross the surface. As a result, the mechanical strength of the supporting wafer can be enhanced so as to prevent the occurrence of slip of the supporting wafer during the heat treatment.

Yet further, the bonded wafer according to the present invention can be obtained simply by causing the crystal of the ingot for the supporting wafer to contain the oxygen at the concentration of $16 \times 10^{17}$ atoms/cm$^3$ or more when pulling up the ingot. Consequently, the bonded wafer having the above-described effect can be manufactured at low cost.

If the oxygen concentration of the supporting wafer is below $16 \times 10^{17}$ atoms/cm$^3$ as measured in the old ASTM, a sufficient BMD or OSF could not be obtained. A preferred oxygen concentration is in a range of $17 \times 10^{17}$ to $20 \times 10^{17}$ atoms/cm$^3$.

A fourth invention provides a manufacturing method of an SOI wafer as defined in the first invention, further comprising the steps of:

ion-implanting of hydrogen gas or a noble gas element to the active layer wafer to thereby form an ion-implanted layer in said active layer wafer;

subsequently bonding the active layer wafer and the supporting wafer together to thereby form a bonded wafer; and then heat treating the bonded wafer by holding it at a predetermined temperature to thereby induce cleavage in the bonded wafer at the site of the ion-implanted layer as an interface.

A fifth invention provides a manufacturing method of an SOI wafer as defined in the second invention, further comprising the steps of:

ion-implanting of hydrogen gas or a noble gas element to the active layer wafer to thereby form an ion-implanted layer in the active layer wafer;

subsequently bonding the active layer wafer and the supporting wafer together to thereby form a bonded wafer; and then heat treating the bonded wafer by holding it at a predetermined temperature to thereby induce cleavage in the bonded wafer at the site of the ion-implanted layer as an interface.

A sixth invention provides a manufacturing method of an SOI wafer as defined in the third invention, further comprising the steps of:

ion-implanting of hydrogen gas or a noble gas element to the active layer wafer to thereby form an ion-implanted layer in the active layer wafer;

subsequently bonding the active layer wafer and the supporting wafer together to thereby form a bonded wafer; and then heat treating the bonded wafer by holding it at a predetermined temperature to thereby induce cleavage in the bonded wafer at the site of the ion-implanted layer as an interface.

The element to be ion-implanted may include, for example, helium (He), neon (Ne), argon (Ar), krypton (Kr), xenon (Xe) and radon (Rn), which are the noble gas element, in addition to the hydrogen (H). Those elements may be provided in a single element or as a component of the chemical compound.

The dose of the light element for the ion implantation is not limited. For example, the dose may be in a range of $2 \times 10^{16}$ atoms/cm$^2$ to $8 \times 10^{16}$ atoms/cm$^2$.

The acceleration voltage used in the ion implantation of the light element may be not higher than 50 keV, preferably not higher than 30 keV and more preferably not higher than 20 keV. In the ion implantation of such a light element, the light element can be more precisely controlled so that the light element can be concentrated in a depth of target by using the lower acceleration voltage, which is more favorable for improving the nonuniformity in the in-plane thickness in the fabrication of the SOI of thin film due to a reduced machining allowance after the cleavage.

The heating temperature of the bonded wafer used for the cleavage is 400° C. or higher, preferably in a range of 400° C. to 700° C. and more preferably in a range of 450° C. to 550° C. It is difficult with the temperature lower than 400° C. to form the bubbles of light element from the light element that has been ion-implanted into the active layer wafer. Inversely, with the temperature higher than 700° C., the oxide deposit will be formed within the active layer and it may deteriorate the properties of devices.

The atmosphere within the furnace during the cleavage may be the atmosphere of non-oxidizing gas (e.g., an inactive gas such as nitrogen, argon). Alternatively, the process may be carried out in vacuum condition.

The heating time of the bonded wafer for the cleavage may be one minute or longer, preferably in a range of 10 minutes to 60 minutes. It is difficult with the heating time shorter than one minute for the light element that has been ion-implanted into the bonded wafer to form bubbles.

After the cleavage and separation process, the heat treatment for bonding intended to enhance the strength obtained from the heat treatment for bonding of the active layer wafer with the supporting wafer may be provided. The heat treatment in this process may be carried out at a heating temperature of 1100° C. for two hours, for example. The atmospheric gas in the furnace for thermal oxidation may employ the oxygen gas and the like.

A seventh invention provides a manufacturing method of an SOI wafer as defined in the first invention, in which a thickness of the SOI layer is thinner than 0.10 μm.

An eighth invention provides a manufacturing method of an SOI wafer as defined in the second invention, in which a thickness of the SOI layer is thinner than 0.10 μm.

A ninth invention provides a manufacturing method of an SOI wafer as defined in the third invention, in which a thickness of the SOI layer is thinner than 0.10 μm.

A tenth invention provides a manufacturing method of an SOI wafer as defined in the fourth invention, in which a thickness of the SOI layer is thinner than 0.10 μm.

An eleventh invention provides a manufacturing method of an SOI wafer as defined in the fifth invention, in which a thickness of the SOI layer is thinner than 0.10 μm.

A twelfth invention provides a manufacturing method of an SOI wafer as defined in the sixth invention, in which a thickness of said SOI layer is thinner than 0.10 μm.

According to the seventh to the twelfth inventions, even if the active layer and the buried silicon oxide film are processed to have their film thickness reduced to such a level that a laser light for the LPD evaluation can pass through the layer and the film, respectively, the LPD evaluation never detects the micro void existing between the buried insulating film and the supporting wafer as the pseudo defect. Consequently, the reliability of the LPD evaluation for the active layer can be enhanced.

A thirteenth invention provides a manufacturing method of an SOI wafer as defined in any one of the first to the twelfth invention, in which prior to the step of bonding, a rapid thermal process at a temperature in a range of 1100° C. to 1250° C. for five minutes or longer or a high-temperature heat treatment at a temperature in a range of 1050° C. to 1250° C. for one hour or longer is applied to the supporting wafer in a reducing gas atmosphere.

According to the thirteenth invention, the rapid thermal process at the temperature in a range of 1100° C. to 1250° C. for five minutes or longer is applied to the supporting wafer in the reducing gas atmosphere before the step of bonding. Alternatively, the high-temperature heat treatment at the temperature in a range of 1050° C. to 1250° C. for one hour or longer may be applied to the supporting wafer. This can facilitate the outward diffusion of the oxygen present in the vicinity of the top and the back surfaces of the supporting wafer, so that the oxygen diffuses outward from the top and the back surfaces of the wafer. Accordingly, the oxide film on the inner surface of the COP present in the vicinity of the wafer surface (the inner wall oxidation film) turns to be unsaturated and dissolved, and the COP whose inner wall oxide film having annihilated can be filled with the interstitial silicon present in the peripheral region and thus the COP disappears. Consequently, even if the active layer and the buried silicon oxide film are processed to have their film thickness reduced to such a level that a laser light for the LPD evaluation can pass through the layer and the film, respectively, the LPD evaluation never detects the micro void (COP) existing between the buried insulating film and the supporting wafer as the pseudo defect. Therefore, the reliability of the LPD evaluation of the active layer can be enhanced.

The timing of the rapid thermal process is not limited so far as it is carried out prior to the bonding step between the active layer wafer and the supporting wafer.

The rapid thermal process refers to an operation or a process for rapidly increasing/lowering a temperature of a wafer in order to increase the throughput and the like.

As the reducing gas, hydrogen gas, argon gas, nitrogen gas and a mixture thereof may be employed.

In the rapid thermal process, the COP in the surface would not be annihilated under the temperature of the supporting wafer below 1100° C. Further, if the temperature of the supporting wafer exceeds 1250° C., the slip may occur. A preferred temperature of the supporting wafer in the rapid thermal process is in a range of 1100° C. to 1150° C.

The heating time shorter than five minutes in the rapid thermal process would not annihilate the COP in the top layer. A preferred heating time of the supporting wafer may be in a range of five minutes to ten minutes. Further, the vacancy that is required for the oxygen deposition can be implanted into the wafer from the entire surface of the wafer in the course of rapid cooling from a high temperature in the rapid thermal process, which is favorable for the deposition.

The timing of the high-temperature heat treatment is not limited so far as it is carried out prior to the bonding of the active layer wafer with the supporting wafer.

The reducing gas used in the high-temperature heat treatment may use the same reducing gas as that used in the rapid thermal process.

In the high-temperature heat treatment, the temperature of the supporting wafer below 1050° C. would not annihilate the COP in the surface. Inversely, if the temperature of the supporting wafer exceeds 1250° C., the slip will occur. A preferred temperature of the supporting wafer used herein may be in a range of 1100° C. to 1200° C.

The heating time shorter than one hour in the high-temperature heat treatment tends to lead to insufficient annihilation of the COP in the top layer, and this tendency is more critical specifically in a temperature range of 1050° C. to 1100° C. A preferred heating time of the supporting wafer may be in a range of one hour to two hours.

A fourteenth invention provides an SOI wafer manufactured by a method comprising the steps of:

bonding a wafer for active layer with a supporting wafer via an insulating film interposed therebetween to thereby form a bonded wafer; and then reducing a film thickness in a part of the active layer wafer of the bonded wafer to thereby form an SOI layer for manufacturing the SOI wafer, wherein the supporting wafer that has been bonded has an oxidation induced stacking fault (OSF) entirely across a surface thereof, and a thickness of said SOI layer is thinner than 0.10 μm.

A fifteenth invention provides an SOI wafer as defined in the fourteenth invention, in which the supporting wafer has a nitrogen concentration in a range of $1 \times 10^{14}$ atoms/cm$^3$ to $3 \times 10^{15}$ atoms/cm$^3$ and an oxygen concentration not lower than $12 \times 10^{17}$ atoms/cm$^3$ (old ASTM).

A sixteenth invention provides an SOI wafer manufactured by a method comprising the steps of:

bonding a wafer for active layer with a supporting wafer via an insulating film interposed therebetween to thereby form a bonded wafer; and then reducing a film thickness in a part of the active layer wafer of the bonded wafer to thereby form an SOI layer for manufacturing the SOI wafer, wherein the supporting wafer that has been bonded has an oxygen concentration not lower than $16 \times 10^{17}$ atoms/cm$^3$ (old ASTM), and a thickness of said SOI layer is thinner than 0.10 μm.

Effect of the Invention

According to the present invention, the supporting wafer contains the oxygen at a concentration of $12 \times 10^{17}$ atmos/cm$^3$ or higher in accordance with the old ASTM and the nitrogen at a concentration in a range of $1 \times 10^{14}$ atmos/cm$^3$ to $3 \times 10^{15}$ atmos/cm$^3$. With such a concentration of the oxygen and the like contained in the supporting wafer, a defect density in the supporting wafer would be $1 \times 10^9$/cm$^3$ or higher. This can help improve the mechanical strength of the supporting wafer and thus prevent the occurrence of slip of the supporting wafer during its being heat treated.

Further, the metal impurities, such as Fe, Cu, among others contained in the active layer wafer or the active layer, specifically that can diffuse and thereby permeate through the buried insulating film during the heat treatment after the bonding step can be captured by the defect in the supporting wafer, such as the COP or OSF, serving as the gettering site. As a result, the degree of contamination from the metal impurities in the active layer can be ultimately reduced.

Yet further, such a bonded wafer that has the effect as discussed above can be obtained simply by causing the crystal of ingot for the supporting wafer to contain a predetermined amount of nitrogen and oxygen during the pulling up operation of the ingot. This can help manufacture a bonded wafer having the above-described effect at low cost.

In addition, since there is no crystal defect present in the supporting wafer, even if the active layer and the buried silicon oxide film are processed to have their film thickness reduced, respectively, the LPD evaluation never detects the micro void existing between the buried insulating film and the supporting wafer as the pseudo defect, and so the reliability of the LPD evaluation of the active layer can be enhanced.

Still further, the supporting wafer before the step of bonding is subjected to a rapid thermal process at a temperature in a range of 1100° C. to 1250° C. for five minutes or longer or a high-temperature heat treatment at a temperature in a range of 1050° C. to 1250° C. for one hour or longer. This can facilitate the oxygen present in the vicinity of the top and the back surfaces of the supporting wafer to diffuse outward. Consequently, for example, even if the active layer and the buried silicon oxide film are processed to have their film thickness reduced to such a level that a laser light for the LPD evaluation can pass through the layer and the film, respectively, the LPD evaluation never detects the micro void as the pseudo defect. As a result, the reliability of the LPD evaluation of the active layer can be enhanced.

DESCRIPTION OF REFERENCE NUMERALS

10 Active layer wafer
12a Silicon oxide film (Insulating film)
12b Buried silicon oxide film
13 Active layer
14 Hydrogen ion implanted area (Ion-implanted area)
20 Supporting wafer
30 Bonded wafer

DESCRIPTION OF THE PREFERRED EMBODIMENTS

Preferred embodiments of the present invention will be now described with reference to the attached drawings.

First Embodiment

Figure 1:
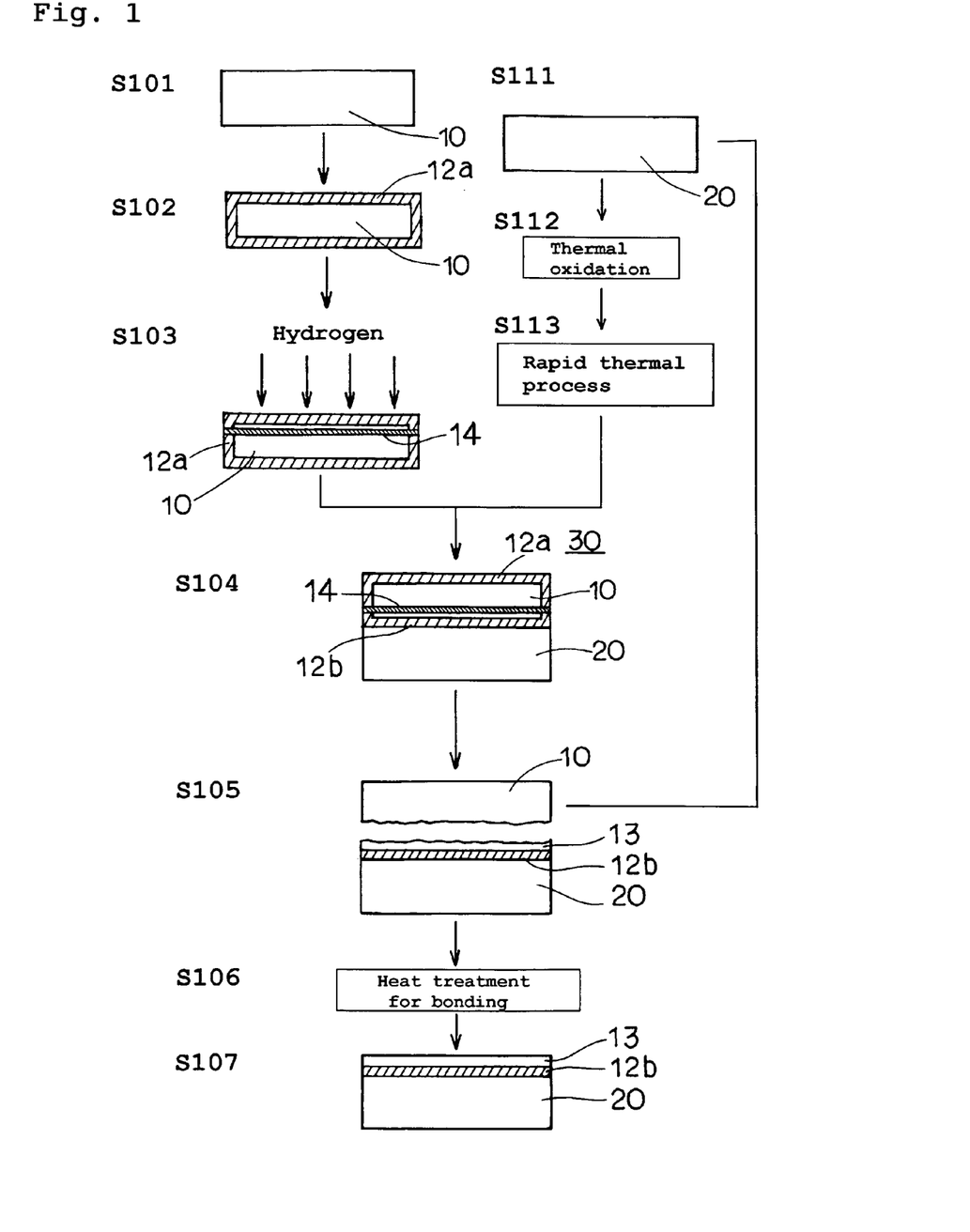
FIG. 1 is a flow sheet showing a manufacturing method of an SOI wafer according to a first embodiment of the present invention.

Firstly, a monocrystal ingot of silicon of p-type that has been doped with boron at a predetermined amount is pulled up in the CZ method, as shown in step S101 of FIG. 1. A rate of pulling up is 1.0 mm/min. After that, the monocrystal ingot of silicon undergoes a series of processing comprising block cutting, slicing, beveling and mirror polishing. Those steps of processing produce a wafer to be prepared as an active layer wafer 10 of p-type and mirror-polished having a thickness of 725 µm, a diameter of 200 mm, a face orientation of (100) face, a specific resistance in a range of 1 Ω cm to 10 Ω cm.

On the other hand, a monocrystal ingot of silicon of p-type that has been doped with the boron and nitrogen by a predetermined amount, respectively, is pulled up in the CZ method as shown in step S111 of FIG. 1. A rate of pulling up (V) and a temperature gradient (G) are controlled such that the monocrystal ingot of silicon may be pulled up with the entire surface thereof covered by the OSF area. In this case, the V is defined as 0.5 mm/min. The nitrogen concentration in the pulling-up process of the crystal is $2\times10^{14}$ atmos/cm$^3$ and the interstitial oxygen atom concentration, Oi, is $13\times10^{17}$ atmos/cm$^3$. After that, the monocrystal ingot of silicon undergoes a series of processing comprising block cutting, slicing, beveling and mirror polishing. Those steps of processing produce a wafer to be prepared as a supporting wafer 20 of p-type and mirror-polished having a thickness of 725 µm, a diameter of 200 mm, a face orientation of (100) face, a specific resistance in a range of 1 Ω cm to 10 Ω cm.

Following that step, a desired number of supporting wafer 20 are introduced into a thermal oxidation device, where the thermal oxidation is applied to the supporting wafers 20 at a temperature of 1000° C. for 16 hours, as shown in step S112 of FIG. 1. Subsequently, thus heat treated supporting wafer is subjected to the etching by 2 µm in the light etching process and then the supporting wafer is observed with an optical microscope for measuring the BMD and the OSF, where it is confirmed that the OSF is present entirely across the wafer surface at a concentration higher than $1\times10^9$/cm$^3$.

Following that step, the supporting wafers 20 are introduced into a RTP unit employing a lamp heating as a heat source, where they are subjected to a rapid thermal process in an atmosphere of argon gas at a temperature of 1150° C. for five minutes, as shown in step S113 of FIG. 1. This can facilitate the OSF in the vicinity of the top and the back surfaces of the supporting wafer 20 to diffuse outward and disappear, and this portion with the OSF lost is formed into a layer of about 0.1 µm to 0.3 µm in depth with no defect included.

Following that step, the active layer wafer 10 is introduced into a thermal oxidation device, where the thermal oxidation is applied to the active layer wafer 10 in an oxygen gas atmosphere, as shown in step S102 of FIG. 1. This forms a silicon oxide film 12a having a thickness of about 0.15 µm entirely across the exposed surface of the active layer wafer 10. The condition of heat treatment may be defined by the heat treatment at a temperature of 1000° C. for seven hours.

Subsequently, an intermediate current ion-implanting device is used to perform the ion implantation of the hydrogen with an acceleration voltage of 50 keV into the active layer wafer 10 from the mirror finished surface thereof at a predetermined depth measured therefrom, as shown in step S103 of FIG. 1. Thus the hydrogen ion implanted area 14 is formed in the active layer wafer 10. The dose used in this step is $5\times10^{16}$ atoms/cm$^2$.

Subsequently, the active layer wafer 10 and the supporting wafer 20 are bonded together by using the surface of the active layer wafer 10 and the mirror-polished surface of the supporting wafer 20 as the bonding surfaces (the superposed surfaces) via the silicon oxide film 12a interposed therebetween with a known jig in a vacuum unit, for example, thus to produce the bonded wafer 30, as shown in step S104 of FIG. 1. In this step, the active layer wafer 10 and the supporting wafer 20 are connected together via the silicon oxide film 12a interposed therebetween, which silicon oxide film 12a at the junction between the active layer wafer 10 and the supporting wafer 20 defines a buried silicon oxide film (insulating film) 12b.

Then, the bonded wafer 30 is introduced into a thermal treatment device for cleavage, though not shown, and heat treated in an atmosphere of nitrogen gas at a furnace temperature of 500° C., as shown in step S105 of FIG. 1. The duration of heat treatment is 30 minutes. As a result of this heat treatment, a part of the active layer wafer 10 is cleaved and separated from the bonded wafer 30 at the site of the hydrogen ion implanted area 14 while leaving the active layer 13 on the bonding interface of the supporting wafer 20.

After the cleavage, the heat treatment for bonding is applied to the bonded wafer 30 in a nitrogen gas atmosphere at a temperature of 1150° C. for two hours, as shown in step S106 of FIG. 1. This heat treatment can enhance the bonding strength between the active layer wafer 10 and the supporting wafer 20.

Following the above step, the surface of the active layer 13 is subjected to the polishing by the polishing device and a sacrificial oxidation for planarization of the SOI surface and for film thickness reduction, as shown step S107 of FIG. 1. Thus a bonded SOI substrate (a bonded wafer) with the active layer 13 of about 0.1 µm thick can be produced.

The nitrogen concentration in the pulling-up process of the crystal is $2\times10^{14}$ atmos/cm$^3$ and the interstitial oxygen atom concentration, Oi, is $13\times10^{17}$ atmos/cm$^3$.

As discussed above, during pulling up of the monocrystal ingot of silicon for the supporting wafer 20, the crystal contains the nitrogen at a concentration of $2\times10^{14}$ atoms/cm$^3$ and the interstitial oxygen atomic concentration, Oi, of $13\times10^{17}$ atoms/cm$^3$. Owing to this, there would be developed a defect of BMD and its associated OSF by an amount exceeding $1\times10^9$/cm$^3$ entirely across the wafer surface. If there are OSF defects encompassing the entire area of the wafer surface, the defect density in the supporting wafer 20 is $1\times10^9$ pices/cm$^3$ or higher. This can improve the mechanical strength of the supporting wafer 20 and thereby prevent the slip of the supporting wafer 20 during the heat treatment.

During the heat treatment after the step of bonding, the metal impurities contained in the supporting wafer 20 in addition to the metal impurities of Fe, Cu, which can permeate through the buried insulating film 12b by the diffusion, among the metal impurities contained in the active layer wafer 10 or the active layer 13 can be captured by the BMD or the OSF. As described above, a large number of OSF exists across the entire surface of the supporting wafer 20, which can serve as the gettering site. Owing to this, the metal impurities contained in the supporting wafer 20 in addition to the metal impurities contained in the active layer wafer 10 or the active layer 13 can be captured satisfactorily. As a result, the degree of contamination from the metal impurities in the active layer 13 can be reduced.

Figure 2:
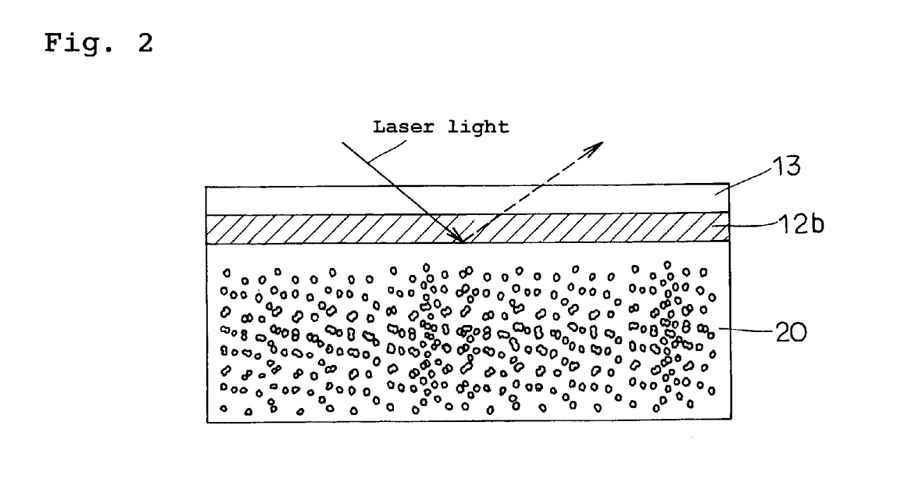
FIG. 2 is an enlarged sectional view of a main part of a bonded wafer during the LPD evaluation test, which has been obtained in a manufacturing method of an SOI wafer according to the first embodiment of the present invention.
Figure 3:
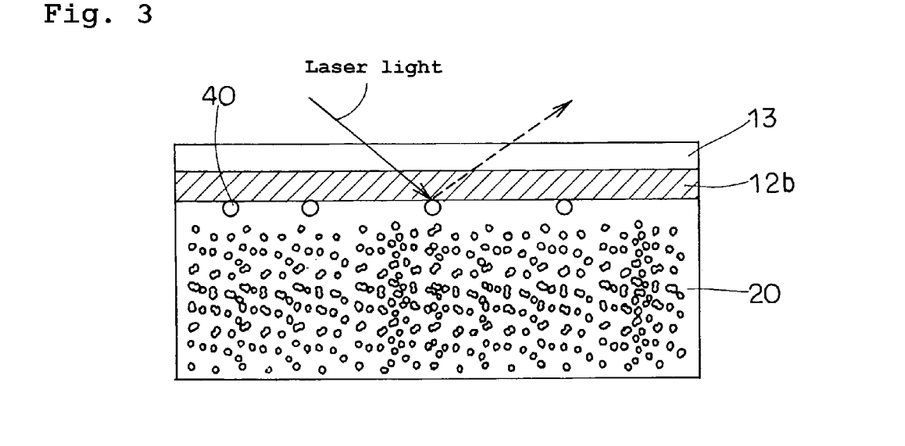
FIG. 3 is an enlarged sectional view of a main part of a bonded wafer during the LPD evaluation test, which has been obtained in a manufacturing method of an SOI wafer according to a means of the prior art.

Further, there is no crystal defect present in the vicinity of the bonding interface of the supporting wafer with the aid of the rapid thermal process, as shown in FIG. 2. Therefore, even if the active layer 13 and the buried silicon oxide film 12b are processed to have their film thickness reduced to such a level that a laser light for the LPD evaluation can pass through the layer and the film, respectively, there would be no more formation of a micro void 40 between the buried silicon oxide film 12b and the supporting wafer 20 as the pseudo defect, which has been typically observed in the prior art. Owing to this, the LPD evaluation never detects the micro void 40 as a pseudo defect, as shown in FIG. 3. Consequently, the reliability of the LPD evaluation of the active layer 13 can be improved.

Furthermore, since such a bonded SOI substrate that has the above-discussed effect can be obtained simply by causing the monocrystal ingot of silicon for the supporting wafer to contain the nitrogen at a concentration of $1 \times 10^{14}$ atmos/cm$^3$ and the oxygen at a concentration of $13 \times 10^{17}$ atmos/cm$^3$ during the pulling up of the ingot, therefore this can help manufacture the bonded SOI substrate having the above-discussed effect at low cost.

Second Embodiment

A manufacturing method of a bonded wafer according to a second embodiment of the present invention will now be described.

The second embodiment represents an example with no addition of nitrogen during pulling-up of a monocrystal ingot of silicon in the CZ method but exclusively having an interstitial oxygen atomic concentration, Oi, of $18 \times 10^{17}$ atmos/cm$^3$.

The supporting wafer after its having been pulled up is introduced into an annealing unit, where it undergoes a heat treatment in an argon gas atmosphere at a temperature of 1150° C. for two hours. Through this process, any OSF present in the vicinity of the top and the back surfaces of the supporting wafer 20 can disappear, thereby allowing a layer including no crystal defect to be formed in an area originally occupied by the OSF.

Other configuration, operation and effect of the second embodiment are substantially same as those in the first embodiment, and the detailed description thereof should be herein omitted.

In this concern, a report on a result obtained from a comparison and examination with respect to the bonded SOI wafers produced in accordance with the present invention method and the prior art method, respectively, will be herein presented specifically on the occurrence of slip in a back surface of a supporting wafer as well as the distribution of the LPD in an active layer surface in a bonded SOI wafer. It is to be noticed that the occurrence of the slip in the table is indicated by using ○ for the length of slip no longer than 20 mm and × for the length of slip of 20 mm or longer that are observed. The "RTP" indicates a rapid thermal process and the "ArAn" represents an argon annealing.

The thickness of the active layer used is about 0.1 μm and the thickness of the buried silicon oxide film 12b used is 0.15 μm. The X-ray topography (XRT) method was employed for an evaluation method of the slip. Further, to evaluate the distribution of the LPD, a LPD density was measured by using a surface inspection device (manufactured by Tencoal, Model No. SP-1), after light etching (chromic acid etching) by 2 μm having been performed. Table 1 shows the result.

TABLE 1

| | Supporting wafer | Heat treatment prior to bonding | Occurrence of slip in supporting wafer | Distribution of LPD in surface of active layer | BMD, OSF density in supporting wafer |
|---|---|---|---|---|---|
| Test example 1 | Wafer of whole area OSF | RTP | ○ | No particular distribution observed | $1 \times 10^9$/cm$^3$ or higher |
| Test example 2 | Wafer of whole area OSF | No RTP | ○ | More in the center of wafer. Consistent with COP distribution in the supporting wafer. | $1 \times 10^9$/cm$^3$ or higher |
| Test example 3 | Wafer of high oxygen concentration Oi = $18 \times 10^{17}$ | ArAN | ○ | No particular distribution observed | $1 \times 10^9$/cm$^3$ or higher |
| Test example 4 | Wafer of high oxygen concentration Oi = $18 \times 10^{17}$ | No ArAN | ○ | More in the center of wafer. Consistent with COP distribution in the supporting wafer. | $1 \times 10^9$/cm$^3$ or higher |
| Comparative example 1 | Wafer of low oxygen concentration Oi = $14 \times 10^{17}$ | ArAN | X | No particular distribution observed | $1 \times 10^7$~$1 \times 10^8$/cm$^3$ |
| Comparative example 2 | Wafer of low oxygen concentration Oi = $14 \times 10^{17}$ | No ArAN | X | More in the center of wafer. Consistent with COP distribution in the supporting wafer. | $1 \times 10^7$~$1 \times 10^8$/cm$^3$ |

As apparent from Table 1, any one of the test examples 1 to 4 demonstrates that the density of the BMD (Bulk Micro Defect) and the OSF in the supporting wafer is $1\times10^9/cm^3$ or higher. Owing to this, there is no occurrence of slip of 20 mm or longer observed in the back surface of the supporting wafer and also no particular distribution of the LPD or a little more amount of LPD in the wafer center observed in the active layer surface, indicating that an improvement has been achieved over the comparative examples 1 and 2 ($Oi=14\times10^{17}$ atoms/$cm^3$).

It is to be noticed that the supporting wafer used in the test examples 1 and 2 is made from a monocrystal ingot of silicon that has been processed during the pulling-up of the crystal to be doped with nitrogen at a concentration of $2\times10^{14}$ atoms/$cm^3$ and to have the interstitial oxygen concentration of $14\times10^{17}$ atoms/$cm^3$, under a condition of V/G controlled appropriately. Thus, the supporting wafer has been prepared so as to contain a large amount of OSF entirely across the surface.

What is claimed is:

1. A manufacturing method for an SOI wafer, comprising:
   bonding an active layer wafer with a supporting wafer via an insulating film to form a bonded wafer body;
   reducing a film thickness in a part of the active layer wafer that forms a part of the bonded wafer body to form an SOI layer for manufacturing the SOI wafer, wherein
   the supporting wafer has a nitrogen concentration in a range of $1\times10^{14}$ atoms/$cm^3$ to $3\times10^{15}$ atoms/$cm^3$ and an oxygen concentration of equal to or higher than $12\times10^{17}$ atoms/$cm^3$ when measured in accordance with old ASTM so as to have an oxidation induced stacking fault substantially entirely across a surface thereof.

2. The manufacturing method of an SOI wafer in accordance with claim 1, further comprising:
   ion-implanting one of hydrogen gas and a noble gas element to the active layer wafer to form an ion-implanted layer in the active layer wafer, prior to said bonding; and
   heat treating the bonded wafer body to induce cleavage in the bonded wafer body at the site of the ion-implanted layer as an interface so as to form the SOI layer with a remaining active layer.

3. The manufacturing method of an SOI wafer in accordance with claim 2, wherein a thickness of the SOI layer is thinner than 0.10 µm.

4. The manufacturing method of an SOI wafer in accordance with claim 3 further comprising one of:
   applying a rapid thermal process at a temperature in a range of 1100° C. to 1250° C. for five minutes or longer to the supporting wafer in a reducing gas atmosphere, prior to said bonding; and
   applying a high-temperature heat treatment at a temperature in a range of 1050° C. to 1250° C. for one hour or longer to the supporting wafer in a reducing gas atmosphere, prior to said bonding.

5. The manufacturing method of an SOI wafer in accordance with claim 1, wherein a thickness of the SOI layer is thinner than 0.10 µm.

6. The manufacturing method of an SOI wafer in accordance with claim 5 further comprising one of:
   applying a rapid thermal process at a temperature in a range of 1100° C. to 1250° C. for five minutes or longer to the supporting wafer in a reducing gas atmosphere, prior to said bonding; and
   applying a high-temperature heat treatment at a temperature in a range of 1050° C. to 1250° C. for one hour or longer to the supporting wafer in a reducing gas atmosphere, prior to said bonding.

7. The manufacturing method of an SOI wafer in accordance with claim 1 further comprising one of:
   applying a rapid thermal process at a temperature in a range of 1100° C. to 1250° C. for five minutes or longer to the supporting wafer in a reducing gas atmosphere, prior to said bonding; and
   applying a high-temperature heat treatment at a temperature in a range of 1050° C. to 1250° C. for one hour or longer to the supporting wafer in a reducing gas atmosphere, prior to said bonding.

8. The manufacturing method of an SOI wafer in accordance with claim 2 further comprising one of:
   applying a rapid thermal process at a temperature in a range of 1100° C. to 1250° C. for five minutes or longer to the supporting wafer in a reducing gas atmosphere, prior to said bonding; and
   applying a high-temperature heat treatment at a temperature in a range of 1050° C. to 1250° C. for one hour or longer to the supporting wafer in a reducing gas atmosphere, prior to said bonding.

9. An SOI wafer manufactured by the following method:
   bonding an active layer wafer with a supporting wafer via an insulating film to form a bonded wafer body;
   reducing a film thickness in a part of the active layer wafer that forms a part of the bonded wafer body to form an SOI layer for manufacturing the SOI wafer, wherein
   the supporting wafer has a nitrogen concentration in a range of $1\times10^{14}$ atoms/$cm^3$ to $3\times10^{15}$ atoms/$cm^3$ and an oxygen concentration of equal to or higher than $12\times10^{17}$ atoms/$cm^3$ when measured in accordance with old ASTM so as to have an oxidation induced stacking fault entirely across a surface thereof; and a thickness of the SOI layer is thinner than 0.10 µm.

* * * * *